United States Patent
Zhuo et al.

(10) Patent No.: US 10,715,257 B1
(45) Date of Patent: Jul. 14, 2020

(54) LASER POWER CALIBRATION METHOD, DEVICE AND SYSTEM

(71) Applicant: PHOTONIC TECHNOLOGIES (SHANGHAI), CO., LTD., Shanghai (CN)

(72) Inventors: Shenglong Zhuo, Shanghai (CN); Pei Jiang, Shanghai (CN); Xuefeng Chen, Shanghai (CN)

(73) Assignee: PHOTONIC TECHNOLOGIES (SHANGHAI), CO., LTD., Shenzhen (CN)

( * ) Notice: Subject to any disclaimer, the term of this patent is extended or adjusted under 35 U.S.C. 154(b) by 0 days.

(21) Appl. No.: 16/429,152

(22) Filed: Jun. 3, 2019

(30) Foreign Application Priority Data

Mar. 26, 2019 (CN) .......................... 2019 1 0233538

(51) Int. Cl.
*H01S 5/0687* (2006.01)
*H04B 10/564* (2013.01)
*H04B 10/50* (2013.01)

(52) U.S. Cl.
CPC ......... *H04B 10/564* (2013.01); *H01S 5/0687* (2013.01); *H04B 10/504* (2013.01)

(58) Field of Classification Search
CPC ... H04B 10/504; H04B 10/564; H04S 5/0687; H04S 5/0683
See application file for complete search history.

(56) References Cited

U.S. PATENT DOCUMENTS

| | | | |
|---|---|---|---|
| 2008/0310268 A1* | 12/2008 | Chuang | G11B 7/1267 369/47.52 |
| 2013/0095777 A1* | 4/2013 | Muhammad | H03F 3/24 455/127.2 |
| 2014/0004810 A1* | 1/2014 | Cohen | H04B 17/102 455/115.3 |
| 2018/0183208 A1* | 6/2018 | Nerheim | H05C 1/00 |

* cited by examiner

*Primary Examiner* — Dzung D Tran
(74) *Attorney, Agent, or Firm* — IPro, PLLC

(57) ABSTRACT

A laser power calibration method includes: receiving a first power fed back by a transmitter end; comparing a difference of the first power against a second power predefined at the transmitter end; and when the difference exceeds a predefined range, controlling an output power of the transmitter end to be a third power, wherein the third power is an average power of the first power and the second power.

17 Claims, 10 Drawing Sheets

LASER POWER CALIBRATION METHOD, DEVICE AND SYSTEM

CROSS-REFERENCE TO RELATED APPLICATIONS

The present disclosure claims priority to Chinese Patent Application No. 201910233538.X, filed with the Chinese Patent Office on Mar. 26, 2019, titled "LASER POWER CALIBRATION METHOD, APPARATUS, SYSTEM AND LASER POWER CALIBRATION DEVICE", the entire contents of which are incorporated herein by reference.

TECHNICAL FIELD

The present application relates to the technical field of semiconductors, and in particular, relates to a laser power calibration method, device and system.

BACKGROUND

High-precision and high-definition real-time ranging is desired in automatic driving, gesture identification, machine vision and the like fields. Therefore, laser radars and 3D imaging technologies based on time of flight (TOF) of photons are being more and more widely applied.

The laser radars and 3D imaging technologies based on the TOF are composed of a transmitter end and a receiver end. The transmitter end generates pulse-modulated laser signals, and the receiver end detects optical signals reflected from a target object, and calculates a distance to the target object by the TOF of photons. Detection of the distance is mainly subject to a power of the transmitter end and a sensitivity of the receiver end. For implementation of the ranging function, the transmitter end needs to output laser pulses having a controllable and stable power.

During practice of the present application, the inventors have identified that a circuit of the transmitter end and a driven laser device are both sensitive to temperature variations, process deviations, and power source voltages deviations (referred to as PVT variations). These factors may cause deviations of the power of the output laser. These three factors are mainly introduced from the following three aspects. First, during operating of the transmitter end, the temperature may vary at the entire transmitter end due to time and variations of ambient temperature. Second, the laser device and the interior circuit of the transmitter end may be subjected to some process deviations during fabrication. Third, the supplied voltage at the transmitter end may also be deviated. These three major factors may cause the power of the output laser to be deviated from a predefined value, such that the laser radar and 3D sensor may fail to implement the ranging function.

SUMMARY

An embodiment of the present application provides a laser power calibration method. The method includes: receiving a first power fed back by a transmitter end; comparing a difference of the first power against a second power predefined at the transmitter end; and when the difference exceeds a predefined range, controlling an output power of the transmitter end to be a third power, wherein the third power is an average power of the first power and the second power.

Another embodiment of the present application provides a laser power calibration device. The device includes: a processor, a communication interface, a memory and a communication bus; wherein the processor, the memory and the communication bus communicate with each other via the communication bus; and the memory is configured to store at least one executable instruction, wherein the executable instruction causes the processor to perform the following operations: receiving a first power fed back by a transmitter end; comparing a difference of the first power against a second power predefined at the transmitter end; and when the difference exceeds a predefined range, controlling an output power of the transmitter end to be a third power, wherein the third power is an average power of the first power and the second power.

Still another embodiment of the present application provides a laser power calibration system. The system includes: a transmitter end and a laser power calibration device; wherein the transmitter end transmits a laser having the first power as the output power and feeds back the laser to the laser power calibration device; and wherein the laser power calibration device includes: a processor, a communication interface, a memory and a communication bus; wherein the processor, the memory and the communication bus communicate with each other via the communication bus; and the memory is configured to store at least one executable instruction, wherein the executable instruction causes the processor to perform the following operations: receiving a first power fed back by a transmitter end; comparing a difference of the first power against a second power predefined at the transmitter end; and when the difference exceeds a predefined range, controlling an output power of the transmitter end to be a third power, wherein the third power is an average power of the first power and the second power.

BRIEF DESCRIPTION OF THE DRAWINGS

By reading the detailed description of preferred embodiments hereinafter, various other advantages and beneficial effects become clear and apparent for persons of ordinary skill in the art. The accompanying drawings are merely for illustrating the preferred embodiments, but shall not be construed as limiting the present application. In all the accompanying drawings, like reference signs denote like parts. In the drawings.

DETAILED DESCRIPTION

Some exemplary embodiments of the present application are hereinafter described in detail with reference to the accompanying drawings. Although the accompanying drawings illustrate the exemplary embodiments of the present application, it shall be understood that the present application may be practiced in various manners, and the present application shall not be limited by the embodiments illustrated herein. On the contrary, these embodiments are described herein only for the purpose of better understanding the present application, and may integrally convey the scope of the present application to a person skilled in the art.

Figure 1:
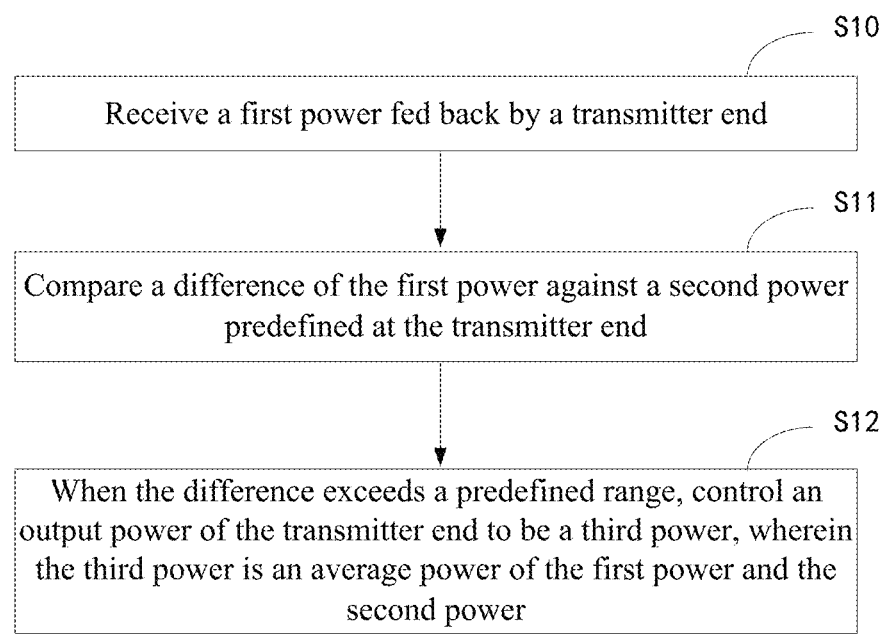
FIG. 1 illustrates a schematic flowchart of a laser power calibration method according to an embodiment of the present application.

FIG. 1 illustrates a schematic flowchart of a laser power calibration method according to an embodiment of the present application. As illustrated in FIG. 1, the laser power calibration method includes the following steps:

Step S10: A first power fed back by a transmitter end is received.

The first power is a current output power of the transmitter end. In step S10, during power calibration, the output power fed back by the transmitter end is received in real time for continuous calibrations.

Step S11: A difference of the first power against a second power predefined at the transmitter end is determined by comparison.

The second power is a bias power or a modulation power of a laser device in the transmitter end and is specifically determined based on applications. During calibration of the bias power of the transmitter end, the second power is the bias power of the transmitter end; and during calibration of the modulation power of the transmitter end, the second power is the modulation power of the transmitter end. Both the bias power and the modulation power are defined by a user according to actual needs. If the laser devices are different or the applications are different, the corresponding bias powers and modulation powers may also be different.

Step 12: When the difference exceeds a predefined range, an output power of the transmitter end is controlled to be a third power, wherein the third power is an average power of the first power and the second power.

Figure 2:
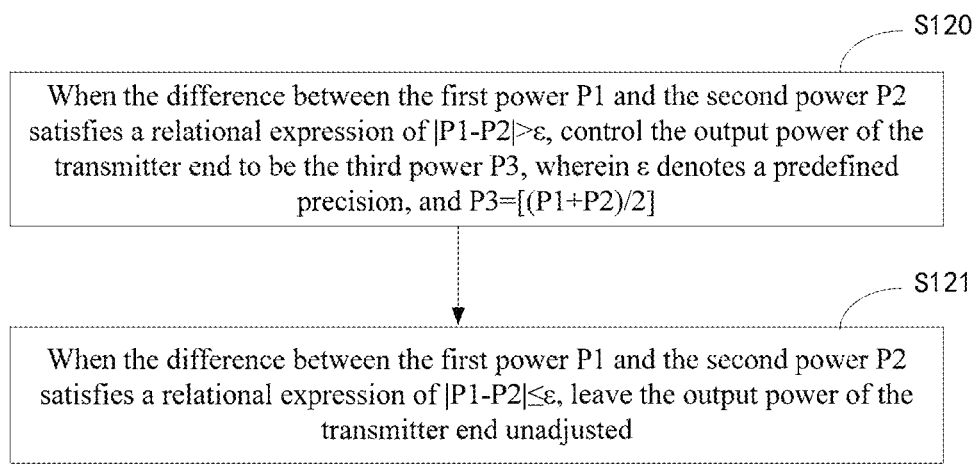
FIG. 2 illustrates a schematic flowchart of step S12 in FIG. 1.

Specifically, as illustrated in FIG. 2, step S12 includes the following sub-steps:

Step S120: When the difference between the first power P1 and the second power P2 satisfies a relational expression of $|P1-P2|>\varepsilon$, the output power of the transmitter end is controlled to be the third power P3, wherein $\varepsilon$ denotes a predefined precision, and $|P3=[(P1+P2)/2]$.

$\varepsilon$ denotes the precision defined by the user according to the actual needs. When $|P1-P2|>\varepsilon$, it indicates that the output power of the transmitter end exceeds a predefined range, and the output power of the transmitter end is adjusted to an arithmetic average value of the first power P1 and the second power P2 by a bisection method.

Figure 3:
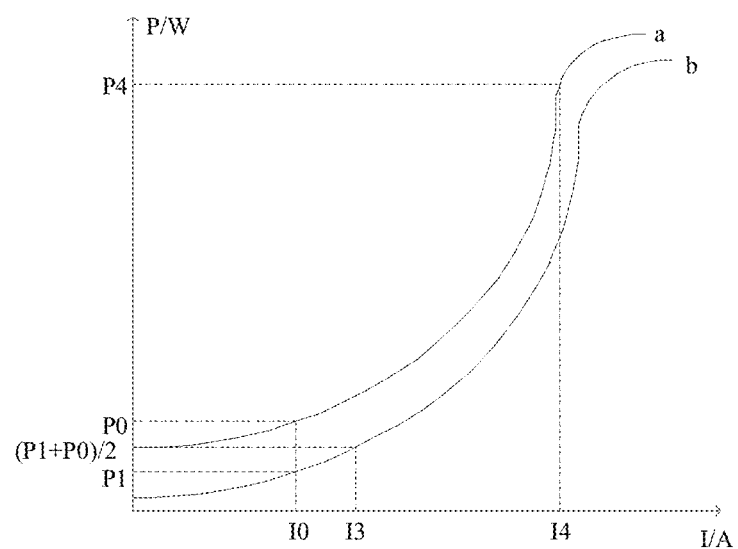
FIG. 3 illustrates a schematic power-current relational curve of a transmitter end.

When the output power of the laser transmitted by the transmitter end is adjusted, a current I3 flowing through the transmitter end may be determined based on the third power P3, and generates a control signal to control the current I3 flowing through the transmitter end, such that the output power of the transmitter end becomes the third power P3. FIG. 3 illustrates a schematic power-current relational curve of a transmitter end. P0 denotes a bias power of the transmitter end and I0 denotes a current flowing through the transmitter end at this time; and P4 denotes a modulation power of the transmitter end and I4 denotes a current flowing through the transmitter end at this time. Using a scenario where the output power of the transmitter end is calibrated using the bias power P0 as the second power P2 as an example, P1 denotes a first power output by the transmitter end, I3 denotes a current of the transmitter end adjusted relative to the defined bias power P0 when PVT varies, and $[(P1+P0)/2]$ denotes a corresponding output power of the transmitter end upon the adjustment. Assume that the current flowing through the laser device may vary with an adaptation mechanism of an internal circuit of the laser device instead of varying with the PVT, with respect to the defined bias power P0, when the PVT varies, the P-I curve of the transmitter end changes from curve a to curve b.

Step S121: When the difference between the first power P1 and the second power P2 satisfies a relational expression of $|P1-P2|\le\varepsilon$, the output power of the transmitter end remains unadjusted.

When $|P1-P2|\le\varepsilon$, it indicates that the output power of the transmitter end is already within the predefined range, and no adjustment is needed.

Figure 4:
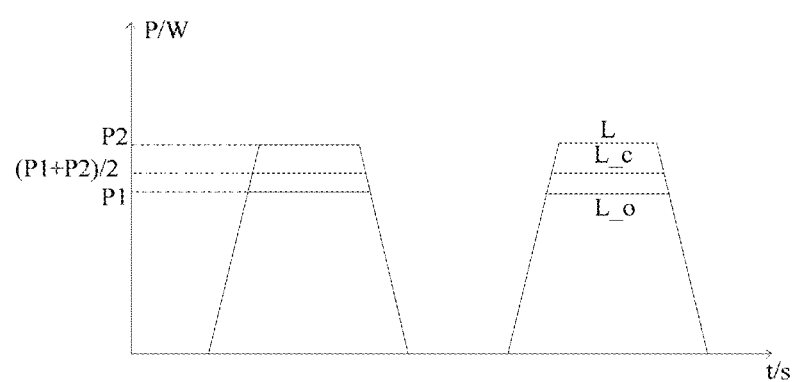
FIG. 4 illustrates a schematic waveform of a laser signal output by the transmitter end.

FIG. 4 illustrates a schematic waveform of a laser signal output by the transmitter end. L denotes a schematic waveform of a laser signal output by the transmitter end when the PVT variations are not considered in the initiate stage. When the PVT variations are introduced, L_o denotes a schematic waveform of a laser signal output by the transmitter end without performing power control and calibration, and L_c denotes a schematic waveform of a laser signal output by the transmitter end with power control and calibration being performed. It may be observed from FIG. 4 that when the power control and calibration is performed to the transmitter end, the laser signal output by the transmitter may better inhibit power variations of the laser signal within a predefined precision range, which are caused by the PVT variations, such that a laser signal having a controllable and stable power is generated.

In the embodiment of the present application, after the output power of the transmitter end is adjusted to the third power, the third power fed back by the transmitter end is received, and the output power of the transmitter end is continuously and cyclically controlled. When a difference between the third power and the second power is within a predefined range, adjustment of the output power of the transmitter end is stopped. Specifically, after the output power of the transmitter end is adjusted to the third power, steps S10 to S12 are repeatedly performed until the difference between the third power and the second power is within the predefined range, and hence adjustment of the output power of the transmitter end is stopped. By continuously and cyclically controlling the output power of the transmitter end, the power variations of the laser signal caused by the PTV variations may be better inhibited within the predefined precision range, such that the transmitter end generates a laser having a controllable and stable power.

In the embodiment of the present application, the second power may be a bias power or a modulation power of the laser device. In practice, the bias power of the laser device is firstly adjusted, such that the laser device is in an optimal bias state, and then the modulation power of the laser device is adjusted, such that the output power of the laser device may be accurately controlled, and the power variations of the laser signal caused by the PTV variations may be better inhibited within the predefined precision range.

In the embodiment of the present application, the first power fed back by the transmitter end is received; the difference of the first power against the second power predefined at the transmitter end is determined by comparison; and when the difference exceeds the predefined range, the output power of the transmitter end is controlled to be the third power, wherein the third power is the average power of the first power and the second power. In this way, the power variations of the laser signal caused by the PVT variations may be inhibited. In addition, the output power of the transmitter end may be better controlled to be within the predefined precision range by continuous and cyclic adjustments, and the laser signal having the controllable and stable power may be generated.

Figure 5:
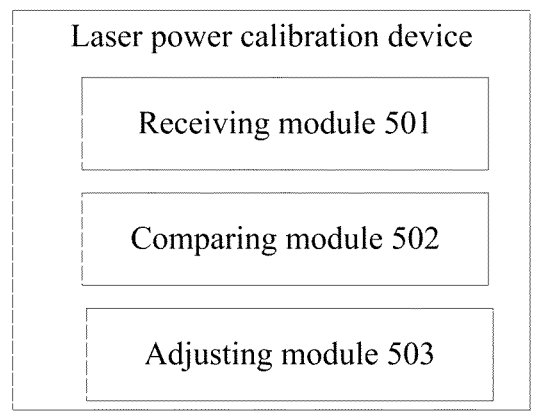
FIG. 5 illustrates a schematic structural diagram of a laser power calibration device according to an embodiment of the present application.

FIG. 5 illustrates a functional block diagram of a laser power calibration device according to an embodiment of the present application. As illustrated in FIG. 5, the laser power calibration device includes: a receiving module 501, a comparing module 502 and an adjusting module 503.

The receiving module 501 is configured to receive a first power fed back by a transmitter end; the comparing module 502 is configured compare a difference of the first power against a second power predefined at the transmitter end; and the adjusting module 503 is configured to, when the difference exceeds a predefined range, control an output power of the transmitter end to be a third power, wherein the third power is an average power of the first power and the second power.

The first power is a current output power of the transmitter end. During power calibration, the receiving module 501 receives in real time the output power fed back by the transmitter end for continuous calibrations.

The adjusting module 503 is further configured to, when the difference between the first power P1 and the second power P2 satisfies a relational expression of $|P1-P2|>\varepsilon$, control the output power of the transmitter end to be the third power P3, wherein $\varepsilon$ denotes a predefined precision, and $P3=[(P1+P2)/2]$; and when the difference between the first power P1 and the second power P2 satisfies a relational expression of $|P1-P2|\leq\varepsilon$, leave the output power of the transmitter end unadjusted. E denotes a precision defined according to the actual needs. When $|P1-P2|>\varepsilon$, it indicates that the output power of the transmitter end exceeds a predefined range, and the output power of the transmitter end is adjusted to an arithmetic average value of the first power P1 and the second power P2 by a bisection method. When $|P1-P2|\leq\varepsilon$, it indicates that the output power of the transmitter end is already within the predefined range, and the output power of the transmitter end does not need to be adjusted.

The adjusting module 503 is further configured to: determine a current flowing through the transmitter end based on the third power; and generate a control signal to control the current flowing through the transmitter end, such that the output power of the transmitter end becomes the third power.

In some embodiments, the receiving module 501 is further configured to: receive the third power fed back by the transmitter end; and continuously and cyclically control the output power of the transmitter end; and when a difference between the third power and the second power is within the predefined range, the adjusting module 503 is further configured to stop controlling the output power of the transmitter end. Specifically, after the adjusting module 503 adjusts the output power of the transmitter end to the third power, the receiving module 501 receives the third power fed back by the transmitter end, and the comparing module 502 and the adjusting module 503 repeatedly implement their corresponding functions to continuously and cyclically control the output power of the transmitter end. When the difference between the third power and the second power is within the predefined range, adjustment of the output power of the transmitter end is stopped. By continuously and cyclically controlling the output power of the transmitter end, the power variations of the laser signal caused by the PTV variations may be better inhibited within the predefined precision range, such that the transmitter end generates a laser having a controllable and stable power.

The second power is a bias power or a modulation power of a laser device in the transmitter end and is specifically determined based on applications. During calibration of the bias power of the transmitter end, the second power is the bias power of the transmitter end; and during calibration of the modulation power of the transmitter end, the second power is the modulation power of the transmitter end. Both the bias power and the modulation power are defined by a user according to the actual needs. If the laser devices are different or the applications are different, the corresponding bias powers and modulation powers may also be different. In practice, the bias power of the laser device is firstly adjusted, such that the laser device is in an optimal bias state, and then the modulation power of the laser device is adjusted, such that the output power of the laser device may be accurately controlled, and the power variations of the laser signal caused by the PTV variations may be better inhibited within the predefined precision range.

In the embodiment of the present application, the first power fed back by the transmitter end is received by the receiving module 501; the difference of the first power against the second power predefined at the transmitter end is determined by comparison by the comparing module 502; and when the difference exceeds the predefined range, the output power of the transmitter end is controlled by the adjusting module 503 to be a third power, wherein the third power is the average power of the first power and the second power. In this way, the power variations of the laser signal caused by the PVT variations may be inhibited. In addition, the output power of the transmitter end may be better controlled to be within the predefined precision range by continuous and cyclic adjustments, and the laser signal having the controllable and stable power may be generated.

Figure 6:
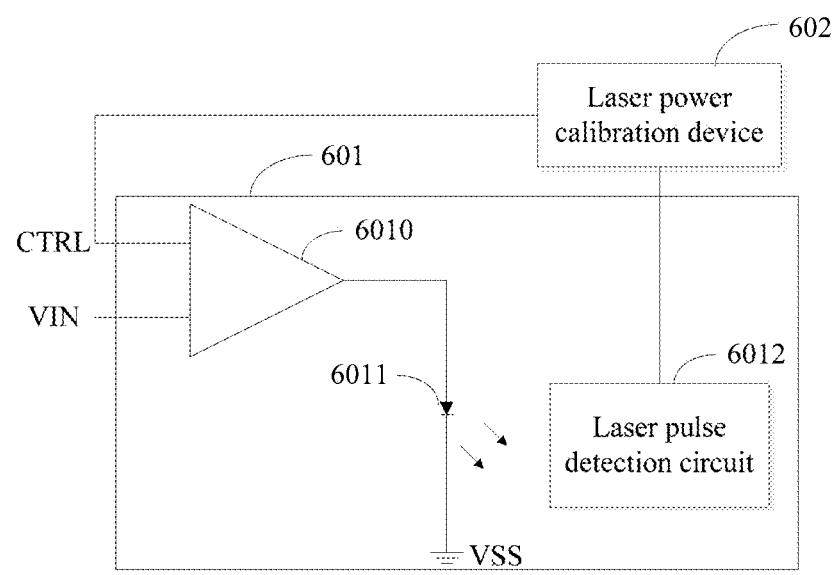
FIG. 6 illustrates a schematic structural diagram of a laser power calibration system according to an embodiment of the present application.

FIG. 6 illustrates a schematic structural diagram of a laser power calibration system according to an embodiment of the present application. As illustrated in FIG. 6, the laser power calibration system includes: a transmitter end 601 and a laser power calibration device 602. The transmitter end 601 is configured to transmit a laser having a first power as an output power, and feed back the laser to the laser power calibration device 602. The laser power calibration device 602 is configured to compare a difference of the first power against a second power predefined at the transmitter end 601. When the difference exceeds a predefined range, the laser power calibration device 602 controls the output power of the transmitter end 601 to be a third power, wherein the third power is an average power of the first power and the second power.

In the embodiment of the present application, the laser power calibration device 602 is configured to: when it is judged that the difference between the first power P1 and the second power P2 satisfies a relational expression of $|P1-P2|>\varepsilon$, control the output power of the transmitter end to be the third power P3, wherein c denotes a predefined precision which may be defined by a user according to the actual needs, and $P3=[(P1+P2)/2]$; or when it is judged that the difference between the first power P1 and the second power P2 satisfies a relational expression of |P1−P2|≤ε, leave the output power of the transmitter end unadjusted. When |P1−P2|>ε, it indicates that the output power of the transmitter end 601 exceeds the predefined range, the laser power calibration device 602 adjusts the output power of the transmitter end 601 to an arithmetic average value of the first power and the second power by a bisection method; and when |P1−P2|≤ε, it indicates that in this case the output power of the transmitter end 601 exceeds the predefined range, and the output power of the transmitter end does not need to be adjusted.

The transmitter end 601 continues to feed back the third power to the laser power calibration device 602. The laser power calibration device 602 continuously and cyclically controls the output power of the transmitter end 601, and stops adjusting the output power of the transmitter end 601 when a difference between the output power of the transmitter end 601 and the second power is within the predefined range. By continuously and cyclically controlling the output power of the transmitter end 601 by the laser power calibration device 602, the power variations of the laser signal caused by the PTV variations may be better inhibited within the predefined precision range, such that the transmitter end 601 generates a laser having a controllable and stable power.

In the embodiment of the present application, the transmitter end 601 includes: a laser drive 6010, a laser device 6011 and a laser pulse detection circuit 6012. A first terminal of the laser drive 6010 is connected to the laser power calibration device 602, a second terminal of the laser drive 6010 is connected to one terminal of the laser device 6011, and a third terminal of the laser drive 6010 is connected to an input signal VIN, wherein the other terminal of the laser device 6011 is connected to ground VSS. One terminal of the laser pulse detection circuit 6012 is configured to receive a laser transmitted by the laser device 6011 to detect a first power of the laser transmitted by the laser device 6011, and the other terminal of the laser pulse detection circuit 6012 is connected to the laser power calibration device 602. The laser pulse detection circuit 6012 is configured to feed back the detected first power to the laser power calibration device 602. The laser power calibration device 602 is configured to determine a current flowing through the transmitter end 601 based on the third power, and generate a control signal CTRL. The laser drive 6010 is configured to receive the control signal CTRL from the laser power calibration device 602, and control a current flowing through the laser device 6011 based on the control signal CTRL, such that the output power of the laser device 6011 is the third power. More specifically, the laser device 6011 is preferentially a laser diode with a positive electrode being connected to the laser drive and a negative electrode being connected to ground. The first terminal of the laser drive 6010 receives the control signal CTRL from the laser power calibration device 602 for adjusting the current flowing through the laser device 6011, and the third terminal of the laser drive 6010 is connected to the input signal VIN for indicating whether to adjust the output power of the laser device 6011.

The laser pulse detection circuit 6012 is further configured to detect the third power of the laser transmitted by the laser device 6011, and feed back the detected third power to the laser power calibration device 602. The laser power calibration device 602 receives the third power fed back by the laser pulse detection circuit 6012, and continuously and cyclically controls the output power of the laser device 6011, and stops controlling the output power of the laser device 6011 when the difference between the third power and the second power is within the predefined range.

Figure 7:
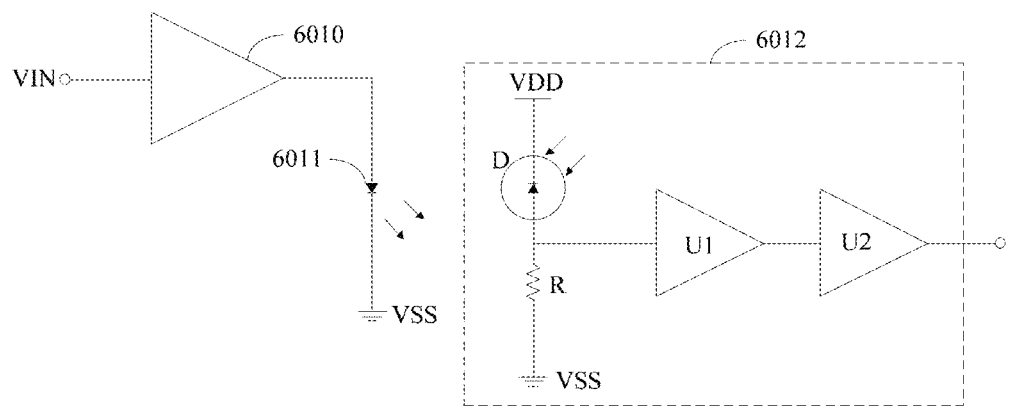
FIG. 7 illustrates a schematic structural diagram of a laser pulse detection circuit in FIG. 6.

As illustrated in FIG. 7, the laser pulse detection circuit 6012 includes: a photodiode D, a resistor R, an amplifier U1 and an analog-to-digital converter U2. A first terminal of the photodiode D is connected to a power source VDD, and a second terminal of the photodiode D is connected to ground VSS via the resistor R. A second terminal of the photodiode D is further connected to an input terminal of the amplifier U1. An output terminal of the amplifier U1 is connected to an input terminal of the analog-to-digital converter U2. An output terminal of the analog-to-digital converter U2 is connected to the laser power calibration device 602. The first terminal of the photodiode D is a positive electrode and the second terminal of the photodiode D is a negative electrode. The photodiode D receives the laser transmitted by the laser device 6011, and converts the laser into a power electrical signal, and transmits the signal to the laser power calibration device 602 after the signal is amplified by the amplifier U1 and converted by the analog-to-digital converter U2.

It should be noted that the second power is a bias power or a modulation power of the laser device 6011. Both the bias power and the modulation power are defined by a user according to the actual needs. If the laser devices 601 are different or the applications are different, the corresponding bias powers and modulation powers may also be different. In practice, the bias power of the laser device 6011 is firstly adjusted, such that the laser device 6011 is in an optimal bias state, and then the modulation power of the laser device 6011 is adjusted, such that the output power of the laser device 6011 may be accurately controlled, and the power variations of the laser signal caused by the PTV variations may be better inhibited within the predefined precision range.

In the embodiment of the present application, the first power fed back by the transmitter end is received; the difference of the first power against the second power predefined at the transmitter end is determined by comparison; and when the difference exceeds the predefined range, the output power of the transmitter end is controlled to be a third power, wherein the third power is the average power of the first power and the second power. In this way, the power variations of the laser signal caused by the PVT variations may be inhibited.

Figure 8:
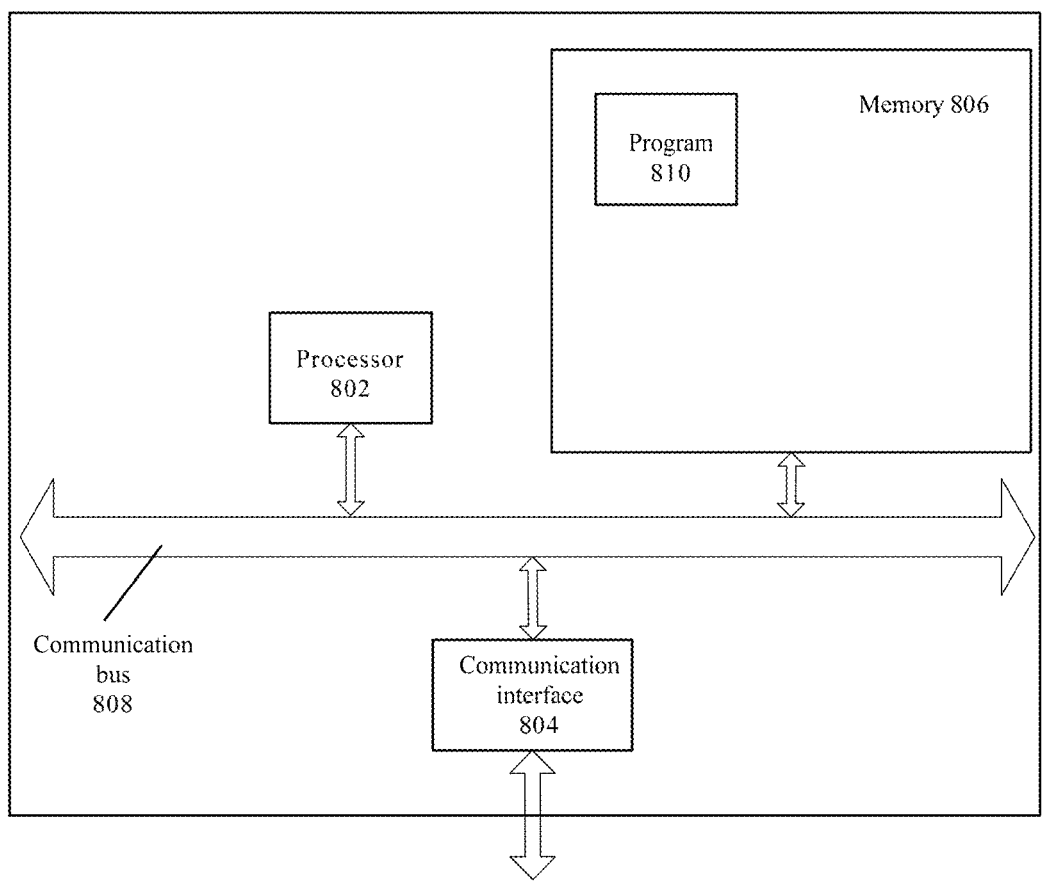
FIG. 8 illustrates a schematic structural diagram of a laser power calibration device according to an embodiment of the present application.

FIG. 8 illustrates a schematic structural diagram of a laser power calibration device according to an embodiment of the present application. As illustrated in FIG. 8, the laser power calibration device includes: a processor 802, a communication interface 804, a memory 806 and a communication bus 808.

The processor 802, the communication interface 804 and the memory 806 communicate with each other via the communication bus 808. The communication interface 804 is configured to communicate with a network element such as a client, a server or the like. The processor 802 is configured to execute a program 810, and may specifically steps in the embodiments of the laser power calibration method.

Specifically, the program 810 may include a program code, wherein the program code includes a computer-executable instruction.

The processor 802 may be a central processing u nit (CPU) or an Application Specific Integrated Circuit (ASIC), or configured as one or more integrated circuits for implementing the embodiments of the present application. The laser power calibration device includes one or more processors, which may be the same type of processors, for example, one or more CPUs, or may be different types of processors, for example, one or more CPUs and one or more ASICs.

The memory 806 is configured to store the program 810. The memory 806 may include a high-speed RAM memory, or may also include a non-volatile memory, for example, at least one magnetic disk memory.

The program 810 may be specifically configured to cause the processor 802 to perform the following operations:

receiving a first power fed back by a transmitter end;

comparing a difference of the first power against a second power predefined at the transmitter end; and when the difference exceeds a predefined range, controlling an output power of the transmitter end to be a third power, wherein the third power is an average power of the first power and the second power.

In some embodiments, the program 810 causes the processor to perform the following operations:

receiving the third power fed back by the transmitter end;

continuously and cyclically controlling the output power of the transmitter end; and when a difference between the third power and the second power is within the predefined range, stopping controlling the output power of the transmitter end.

In some embodiments, the second power is a bias power or a modulation power of a laser device at the transmitter end.

In some embodiments, the program 810 is controlled to further cause the processor to further perform the following operations:

when the difference between the first power P1 and the second power P2 satisfies a relational expression of $|P1-P2|>\varepsilon$, controlling the output power of the transmitter end to be the third power P3, wherein E denotes a predefined precision, and $P3=[(P1+P2)/2]$; and when the difference between the first power P1 and the second power P2 satisfies a relational expression of $|P1-P2|\leq\varepsilon$, leaving the output power of the transmitter end unadjusted.

Figure 9:
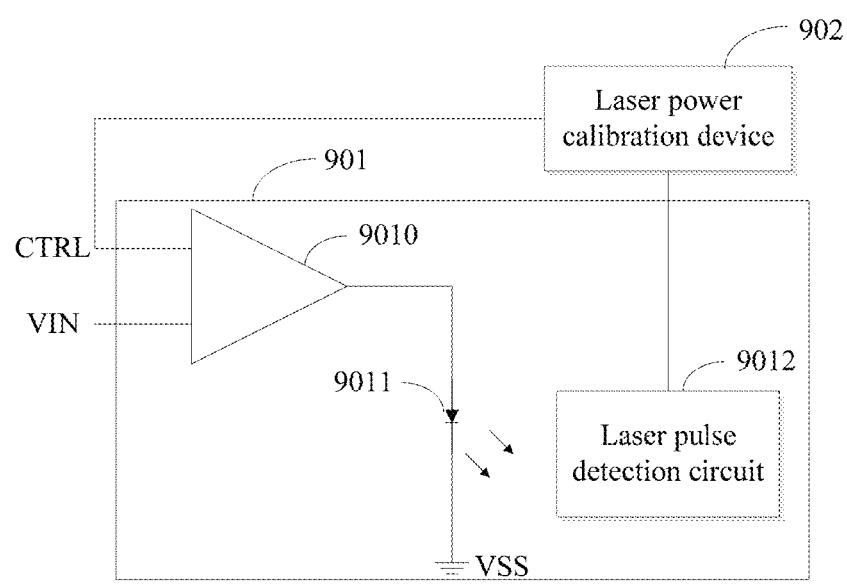
FIG. 9 illustrates a schematic structural diagram of a laser power calibration system according to an embodiment of the present application.

FIG. 9 illustrates a schematic structural diagram of a laser power calibration system according to an embodiment of the present application. As illustrated in FIG. 9, the laser power calibration system includes: a transmitter end 901 and a laser power calibration device 902. The transmitter end 901 is configured to transmit a laser having the first power as an output power, and feed back the laser to the laser power calibration device 902. The laser power calibration device 902 is configured to compare a difference of the first power against a second power predefined at the transmitter end 901. When the difference exceeds a predefined range, the laser power calibration device 902 controls and adjusts the output power of the transmitter end 901 to be a third power, wherein the third power is an average power of the first power and the second power.

In the embodiment of the present application, the laser power calibration device 902 is configured to: when it is judged that the difference between the first power P1 and the second power P2 satisfies a relational expression of $|P1-P2|>\varepsilon$, control and adjust the output power of the transmitter end to be the third power P3, wherein E denotes a predefined precision which may be defined by a user according to the actual needs, and $P3=[(P1+P2)/2]$; or when it is judged that the difference between the first power P1 and the second power P2 satisfies a relational expression of $|P1-P2|\leq\varepsilon$, leave the output power of the transmitter end 901 unadjusted. When $|P1-P2|>\varepsilon$, it indicates that the output power of the transmitter end 901 exceeds the predefined range, the laser power calibration device 902 adjusts the output power of the transmitter end 901 to an arithmetic average value of the first power and the second power by a bisection method; and when $|P1-P2|\leq\varepsilon$, it indicates that in this case the output power of the transmitter end 901 exceeds the predefined range, and the output power of the transmitter end 901 does not need to be adjusted.

The transmitter end 901 continues to feed back the third power to the laser power calibration device 902. The laser power calibration device 902 continuously and cyclically controls the output power of the transmitter end 901, and stops adjusting the output power of the transmitter end 901 when a difference between the output power of the transmitter end 901 and the second power is within the predefined range. By continuously and cyclically controlling the output power of the transmitter end 901 by the laser power calibration device 902, the power variations of the laser signal caused by the PTV variations may be better inhibited within the predefined precision range, such that the transmitter end 901 generates a laser having a controllable and stable power.

In the embodiment of the present application, the transmitter end 901 includes: a laser drive 9010, a laser device 9011 and a laser pulse detection circuit 9012. A first terminal of the laser drive 9010 is connected to the laser power calibration device 902, a second terminal of the laser drive 9011 is connected to one terminal of the laser device 9011, and a third terminal of the laser drive 9012 is connected to an input signal VIN, wherein the other terminal of the laser device 9011 is connected to ground VSS. One terminal of the laser pulse detection circuit 9011 is configured to receive a laser emitted by the laser device 9011 to detect a first power of the laser emitted by the laser device 9011, and the other terminal of the laser pulse detection circuit 6012 is connected to the laser power calibration device 902. The laser pulse detection circuit 9012 is configured to feed back the detected first power to the laser power calibration device 902. The laser power calibration device 902 is configured to determine a current flowing through the transmitter end 901 based on the third power, and generate a control signal CTRL. The laser drive 9010 is configured to receive the control signal CTRL from the laser power calibration device 902, and control a current flowing through the laser device 9011 based on the control signal CTRL, such that the output power of the laser device 9011 is the third power. More specifically, the laser device 9011 is preferentially a laser diode with a positive electrode being connected to the laser drive and a negative electrode being connected to ground. The first terminal of the laser drive 9010 receives the control signal CTRL from the laser power calibration device 902 for adjusting the current flowing through the laser device 9011, and the third terminal of the laser drive 6010 is connected to the input signal VIN for indicating whether to adjust the output power of the laser device.

The laser pulse detection circuit 9012 is further configured to detect the third power of the laser emitted by the laser device 9011, and feed back the detected third power to the laser power calibration device 902. The laser power calibration device 902 receives the third power fed back by the transmitter end, and continuously and cyclically controls the output power of the transmitter end, and stops controlling the output power of the laser device 9011 when the difference between the third power and the second power is within the predefined range.

Figure 10:
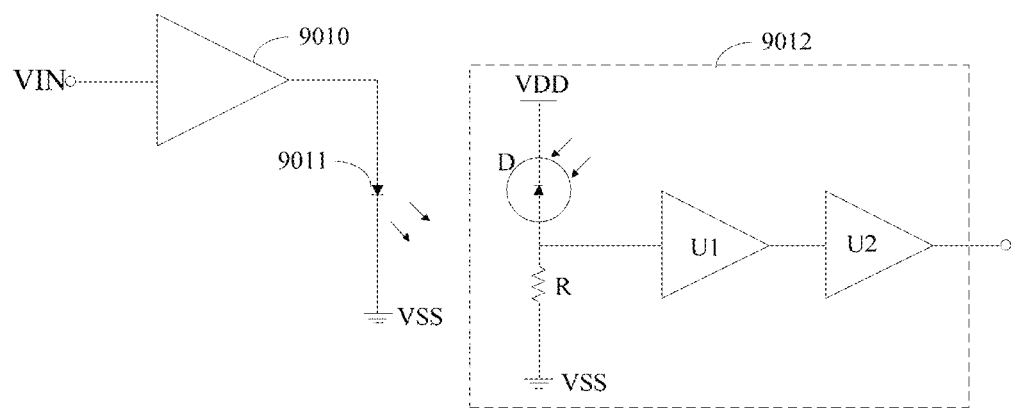
FIG. 10 illustrates a schematic structural diagram of a laser pulse detection circuit in FIG. 9.

As illustrated in FIG. 10, the laser pulse detection circuit 9012 includes: a photodiode D, a resistor R, an amplifier U1 and an analog-to-digital converter U2. A first terminal of the photodiode D is connected to a power source VDD, and a second terminal of the photodiode D is connected to ground VSS via the resistor R. A second terminal of the photodiode D is further connected to an input terminal of the amplifier U1. An output terminal of the amplifier U1 is connected to an input terminal of the analog-to-digital converter U2. An output terminal of the analog-to-digital converter U2 is connected to the laser power calibration device 902. The first terminal of the photodiode D is a positive electrode and the second terminal of the photodiode D is a negative electrode. The photodiode D receives the laser transmitted by the laser device 9011, and converts the laser into a power electrical signal, and transmits the signal to the laser power calibration device 902 after the signal is amplified by the amplifier U1 and converted by the analog-to-digital converter U2.

It should be noted that the second power is a bias power or a modulation power of the laser device. Both the bias power and the modulation power are defined by a user according to the actual needs. If the laser devices are different or the applications are different, the corresponding bias powers and modulation powers may also be different. In practice, the bias power of the laser device 9011 is firstly adjusted, such that the laser device 9011 is in an optimal bias state, and then the modulation power of the laser device 9011 is adjusted, such that the output power of the laser device 9011 may be accurately controlled, and the power variations of the laser signal caused by the PTV variations may be better inhibited within the predefined precision range.

In the embodiment of the present application, the first power fed back by the transmitter end is received; the difference of the first power against the second power predefined at the transmitter end is determined by comparison; and when the difference exceeds the predefined range, the output power of the transmitter end is controlled to be a third power, wherein the third power is the average power of the first power and the second power. In this way, the power variations of the laser signal caused by the PVT variations may be inhibited. In addition, the output power of the transmitter end may be better controlled to be within the predefined precision range by continuous and cyclic adjustments, and the laser signal having the controllable and stable power may be generated.

An embodiment of the present application further provides a non-volatile computer storage medium, wherein the computer storage medium stores at least one executable instruction, which may be executed to perform the laser power calibration method in any of the above method embodiments.

In the specification provided herein, a plenty of particular details are described. However, it may be understood that an embodiment of the present application may also be practiced without these particular details. In some embodiments, well known methods, structures and technologies are not illustrated in detail so as not to obscure the understanding of the specification.

Likewise, it shall be understood that, to streamline the present application and facilitate understanding of one or more of various aspects of the present application, in the above description of the exemplary embodiments of the present application, various features of the present application are sometimes incorporated in an individual embodiment, drawing or description thereof. However, the method according to the present application shall not be explained to embody the following intension: the present application seeking protection claims more features than those explicitly disclosed in each of the appended claims. To be more exact, as embodied in the appended claims, the inventive aspects lie in that fewer features than all the features embodied in an individual embodiment as described above. Therefore, the claims observing the specific embodiments are herein incorporated into the specific embodiments, and each claim may be deemed as an individual embodiment of the present application.

Those skilled in the art should understand that modules in the devices according to the embodiments may be adaptively modified and these modules may be configured in one or more devices different from the embodiments herein. Modules or units or components in the embodiments may be combined into a single module or unit or component, and additionally these modules, units or components may be practiced in a plurality of sub-modules, subunits or subcomponents. Besides that such features and/or processes or at least some of the units are mutually exclusive, all the features disclosed in this specification (including the appended claims, abstract and accompanying drawings) and all the processes or units in such disclosed methods or devices may be combined in any way. Unless otherwise stated, each of the features disclosed in this specification (including the appended claims, abstract and accompanying drawings) may be replaced by a provided same, equivalent or similar substitution.

In addition, those skilled in the art shall understand that, although some embodiments described herein include some features included in other embodiments, rather than other features, a combination of the features in different embodiments signifies that the features are within the scope of the present application and different embodiments may be derived. For example, in the claims appended hereinafter, any one of the embodiments seeking protection may be practiced in any combination manner.

It should be noted that the above embodiments illustrate rather than limit the present application, and those skilled in the art may design alternative embodiments without departing from the scope of the appended claims. In the claims, any reference sign placed between the parentheses shall not be construed as a limitation to a claim. The word "comprise" or "include" does not exclude the presence of an element or a step not listed in a claim. The word "a" or "an" used before an element does not exclude the presence of a plurality of such elements. The present application may be implemented by means of a hardware including several distinct elements and by means of a suitably programmed computer. In a unit claim enumerating several devices, several of the devices may be embodied by one and the same hardware item. Use of the words "first", "second", "third" and the like does not mean any ordering. Such words may be construed as naming.

What is claimed is:

1. A laser power calibration method, comprising:
   receiving a first power fed back by a transmitter end;
   comparing a difference of the first power against a second power predefined at the transmitter end; and
   when the difference exceeds a predefined range, controlling an output power of the transmitter end to be a third power, wherein the third power is an average power of the first power and the second power;
   wherein, the second power is a bias power or a modulation power, the laser device has an optimal bias state in which the laser device has an optimal bias power; when the second power is the modulation power, the laser device is in the optimal bias state.

2. The method according to claim 1, further comprising:
   receiving the third power fed back by the transmitter end;

continuously and cyclically controlling the output power of the transmitter end; and when a difference between the third power and the second power is within the predefined range, stopping controlling the output power of the transmitter end.

3. The method according to claim 1, wherein the second power is a bias power or a modulation power of a laser device at the transmitter end.

4. The method according to claim 1, wherein the controlling the output power of the transmitter end to be the third power comprises:
determining a current flowing through the transmitter end based on the third power; and
generating a control signal to control the current flowing through the transmitter end, such that the output power of the transmitter end becomes the third power.

5. The method according to claim 1, wherein the controlling the output power of the transmitter end to be the third power comprises:
when the difference between the first power P1 and the second power P2 satisfies a relational expression of $|P1-P2|>\varepsilon$, controlling the output power of the transmitter end to be the third power P3, wherein c denotes a predefined precision, and $P3=[(P1+P2)/2]$; or
when the difference between the first power P1 and the second power P2 satisfies a relational expression of $|P1-P2|\le\varepsilon$, leaving the output power of the transmitter end unadjusted.

6. A laser power calibration device, comprising: a processor, a communication interface, a memory and a communication bus; wherein
the processor, the memory and the communication bus communicate with each other via the communication bus; and
the memory is configured to store at least one executable instruction, wherein the executable instruction causes the processor to perform the following operations:
receiving a first power fed back by a transmitter end;
comparing a difference of the first power against a second power predefined at the transmitter end; and
when the difference exceeds a predefined range, controlling an output power of the transmitter end to be a third power, wherein the third power is an average power of the first power and the second power.

7. The device according to claim 6, wherein the executable instruction causes the processor to perform the following operations:
receiving the third power fed back by the transmitter end;
continuously and cyclically controlling the output power of the transmitter end; and
when a difference between the third power and the second power is within the predefined range, stopping controlling the output power of the transmitter end.

8. The device according to claim 6, wherein the second power is a bias power or a modulation power of a laser device at the transmitter end.

9. The device according to claim 6, wherein the controlling the output power of the transmitter end to be the third power comprises:
determining a current flowing through the transmitter end based on the third power; and
generating a control signal to control the current flowing through the transmitter end, such that the output power of the transmitter end becomes the third power.

10. The device according to claim 6, wherein the controlling the output power of the transmitter end to be the third power comprises:

when the difference between the first power P1 and the second power P2 satisfies a relational expression of $|P1-P2|>\varepsilon$, controlling the output power of the transmitter end to be the third power P3, wherein c denotes a predefined precision, and $P3=[(P1+P2)/2]$; or
when the difference between the first power P1 and the second power P2 satisfies a relational expression of $|P1-P2|\le\varepsilon$, leaving the output power of the transmitter end unadjusted.

11. The device according to claim 6, wherein, the second power is a bias power or a modulation power, the laser device has a optimal bias state in which the laser device has a optimal bias power; when the second power is the modulation power, the laser device is in the optimal bias state.

12. A laser power calibration system, comprising: a transmitter end and a laser power calibration device; wherein the transmitter end transmits a laser having the first power as the output power and feeds back the laser to the laser power calibration device, and wherein the laser power calibration device comprises: a processor, a communication interface, a memory and a communication bus; wherein the processor, the memory and the communication bus communicate with each other via the communication bus; and
the memory is configured to store at least one executable instruction, wherein the executable instruction causes the processor to perform the following operations:
receiving a first power fed back by a transmitter end;
comparing a difference of the first power against a second power predefined at the transmitter end; and
when the difference exceeds a predefined range, controlling an output power of the transmitter end to be a third power, wherein the third power is an average power of the first power and the second power.

13. The system according to claim 12, wherein the executable instruction causes the processor to perform the following operations:
receiving the third power fed back by the transmitter end;
continuously and cyclically controlling the output power of the transmitter end; and
when a difference between the third power and the second power is within the predefined range, stopping controlling the output power of the transmitter end.

14. The system according to claim 12, wherein the second power is a bias power or a modulation power of a laser device at the transmitter end.

15. The system according to claim 12, wherein the controlling the output power of the transmitter end to be the third power comprises:
determining a current flowing through the transmitter end based on the third power; and
generating a control signal to control the current flowing through the transmitter end, such that the output power of the transmitter end becomes the third power.

16. The system according to claim 12, wherein the controlling the output power of the transmitter end to be the third power comprises:
when the difference between the first power P1 and the second power P2 satisfies a relational expression of $|P1-P2|>\varepsilon$, controlling the output power of the transmitter end to be the third power P3, wherein c denotes a predefined precision, and $P3=[(P1+P2)/2]$; or
when the difference between the first power P1 and the second power P2 satisfies a relational expression of $|P1-P2|\le\varepsilon$, leaving the output power of the transmitter end unadjusted.

17. The system according to claim 12, wherein, the second power is a bias power or a modulation power, the laser device has a optimal bias state in which the laser device has a optimal bias power; when the second power is the modulation power, the laser device is in the optimal bias state.

* * * * *